US006995087B2

(12) United States Patent
Liu et al.

(10) Patent No.: US 6,995,087 B2
(45) Date of Patent: Feb. 7, 2006

(54) INTEGRATED CIRCUIT WITH SIMULTANEOUS FABRICATION OF DUAL DAMASCENE VIA AND TRENCH

(75) Inventors: Wuping Liu, Singapore (SG); Juan Boon Tan, Singapore (SG); Bei Chao Zhang, Singapore (SG); Alan Cuthbertson, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 94 days.

(21) Appl. No.: 10/328,512

(22) Filed: Dec. 23, 2002

(65) Prior Publication Data

US 2004/0121585 A1 Jun. 24, 2004

(51) Int. Cl.
*H01L 21/4763* (2006.01)
*H01L 21/44* (2006.01)
(52) U.S. Cl. .................. 438/638; 438/624; 438/625; 438/627; 438/687
(58) Field of Classification Search ........ 438/637–640, 438/634, 671, 700, 706, 717
See application file for complete search history.

(56) References Cited

U.S. PATENT DOCUMENTS 5,856,225 A * 1/1999 Lee et al. ................. 438/291
2002/0187629 A1 * 12/2002 Huang et al.

* cited by examiner

*Primary Examiner*—Ha Tran Nguyen
(74) *Attorney, Agent, or Firm*—Mikio Ishimaru

(57) ABSTRACT

An integrated circuit manufacturing method includes providing a base, forming a first conductor, forming a first barrier layer, forming a first dielectric layer, and forming a masking layer. The method further including forming a first via opening in the masking layer, forming a first trench opening in the masking layer, and simultaneously forming a second via opening in a layer under the masking layer, and forming a second trench opening through the masking layer and in the layer under the masking layer and simultaneously forming a third via opening in another layer under the masking layer. The method further including removing the first barrier layer using the third via opening and the masking layer to form a trench and a via, and filling the trench and the via with a conductor to form a trench and via conductor in contact with the first conductor.

20 Claims, 7 Drawing Sheets

INTEGRATED CIRCUIT WITH SIMULTANEOUS FABRICATION OF DUAL DAMASCENE VIA AND TRENCH

TECHNICAL FIELD

The present invention relates generally to integrated circuits and more specifically to forming dual damascene interconnects for semiconductor devices in integrated circuits.

BACKGROUND ART

Integrated circuit technology has been progressing rapidly to the point where integrated circuits incorporating over a million transistors are possible in such products as cell phones, radios, and TVs. However, the rapid development of technologies, which require such integrated circuits, has increased just as rapidly. Applications such as real-time graphics, high-definition television, virtual reality, and other scientific and industrial applications are demanding higher speed, greater functionality, and even more rapid advances in very large-scale integrated circuit technology.

The demand for more functionality requires a tremendous increase in the number of transistors to be integrated onto a single integrated circuit chip. This requires shrinking the sizes of the transistors and/or having larger die sizes.

As the sizes of the transistors decrease, the resulting increased density requires an increasing number of interconnections within the integrated circuit chip. As the number of interconnections increases, the amount of area on the semiconductor die occupied by the interconnections becomes relatively large and may offset the savings made by reducing the size of the transistors.

A long sought goal in the semiconductor industry for very large-scale integrated circuits has been to achieve minimum area layouts for interconnections because minimum area layouts typically provide optimum performance and economy.

In addition, as the number of transistors proliferate, multiple levels of interconnections are required between the interconnect lines and the vias which connect different levels.

At the present time, the vias are formed first and a via fill step is applied to protect the via bottom from early breakthrough while the dual damascene trench is being etched. This is called the "via-first" manufacturing process. Bottom anti-reflective coatings (BARC), of either organic or inorganic material, are commonly used to fill the vias.

As technology develops, low dielectric constant interlevel dielectric materials are required to reduce capacitance problems between the closer together interconnections in the smaller integrated circuits. However, the low dielectric constant materials cause problems in the via-first manufacturing process.

One of the process problems is that of resist poisoning during the dual damascene trench masking. Where the photoresist is poisoned, the dual damascene trench mask from which the trenches patterned are not well defined and the photoresist above the vias are not fully developed. This means that the interconnects may not be connected or thinner than designed so the resistance is higher and the likelihood of failure is higher.

Another of the process problems is the chemically related post-via processing, i.e., photoresist strip, wet cleaning, and via fill, which may also cause an undesirable change in the dielectric constant of the low dielectric constant material. This is especially true for porous ultra-low dielectric constant films.

A still further process problem as sizes continue to shrink is that it becomes more and more difficult to achieve robust and void-free BARC fill for smaller vias with the via-first process. This further causes problems in maintaining an acceptable process window during via masking with an appropriate resist thickness; i.e., having enough time to form the trench before breakthrough of the photoresist.

Solutions to these problems have been long sought, but have equally as long eluded those skilled in the art.

DISCLOSURE OF THE INVENTION

The present invention provides an integrated circuit manufacturing method which includes providing a base, forming a first conductor, forming a first barrier layer, forming a first dielectric layer, and forming a masking layer. The method further including forming a first via opening in the masking layer, forming a first trench opening in the masking layer, and simultaneously forming a second via opening in a layer under the masking layer, and forming a second trench opening through the masking layer and in the layer under the masking layer and simultaneously forming a third via opening in another layer under the masking layer. The method further including removing the first barrier layer using the third via opening and the masking layer to form a trench and a via, and filling the trench and the via with a conductor to form a trench and via conductor in contact with the first conductor. This method results in a void-free BARC fill for smaller vias with a via-first process, as well as eliminating the processing steps related to the post-via, i.e., photo-resist strip/chemical resist strip, final inspection critical dimension (FICD), via-fill, and/or via-fill etch back, and simplifying the process flow.

The above and additional advantages of the present invention will become apparent to those skilled in the art from a reading of the following detailed description when taken in conjunction with the accompanying drawings.

BEST MODE FOR CARRYING OUT THE INVENTION

The present invention provides a scheme for simultaneous fabrication of dual damascene structures. With these process, the dual damascene via and trench is fabricated within one run of etching. Because via fill is avoided, potential reactions between the dielectric film, the via film material, and the photoresist are prevented, and resist poisoning is not of a concern.

Compared to the current via-first technique, the thickness of photoresist is of least critical importance and a thinner photoresist may be used. Processing steps related to the post-via i.e., photoresist strip/chemical resist strip, final inspection critical dimension (FICD), via-fill, and/or via-fill etch back, are eliminated and overall processing flow is simplified.

Further, a process is available in which there is no middle etch stop dielectric layer and a dual hardmask is used as an anti-reflective coating and hardmask per etch. This avoids using the full fill or BARC etch back scheme that is conventionally used as planarization.

In this situation, a thinner photoresist is used for better process control as the etch process relies more on the hardmask for patterning.

Figure 1:
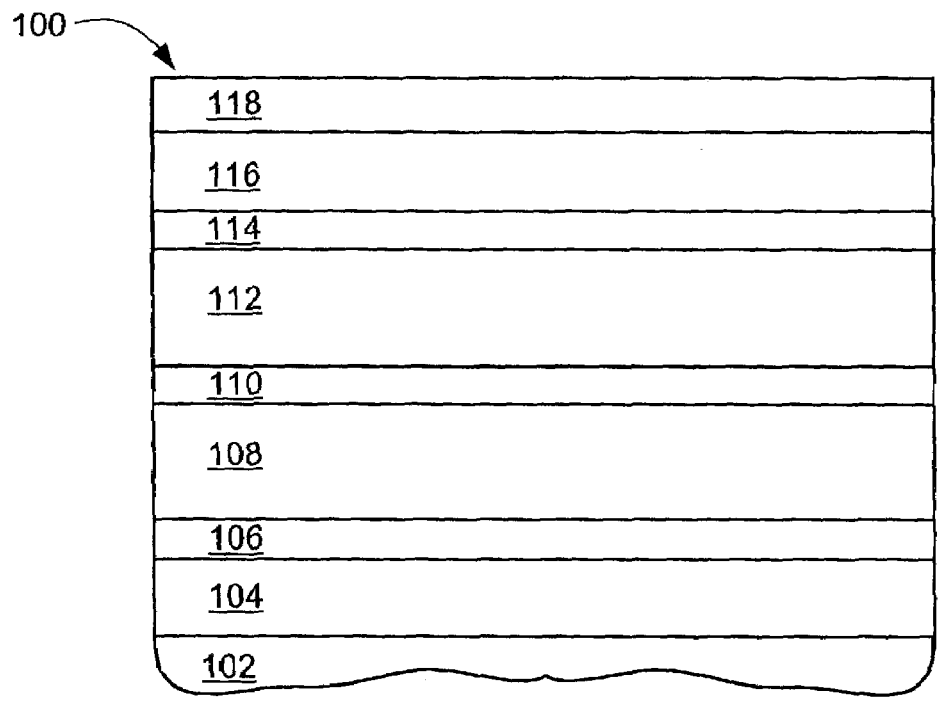
FIG. 1 is a close up of an integrated circuit interconnect region of an integrated circuit in the initial stages of manufacturing in accordance with the present invention.

Referring now to FIG. 1, therein is shown a close up of an integrated circuit interconnect region of an integrated circuit 100 in the initial stages of manufacturing in accordance with the present invention. The integrated circuit 100 has a base 102 which may consist of a substrate containing transistors and various dielectric layers over the transistors (not shown).

Above the base 102 in a trench in a further dielectric layer (not shown in a cross-section) is a first conductor 104. The first conductor 104 is covered by a further dielectric layer, which can be an etch stop layer, designated as a first barrier layer 106. Above the first barrier layer 106 is a first dielectric layer 108 covered by a second barrier layer 110.

Above the second barrier layer 110 is a second dielectric layer 112 covered by a cap dielectric layer, designated as a third barrier layer 114. A sacrificial antireflective coating, designated as a masking layer 116, is arranged over the third barrier layer 114 to allow accurate processing of a via mask or a via photoresist 118 thereon.

The term "horizontal" as used in herein is defined as a plane parallel to the conventional plane or surface of the base 102, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 2:
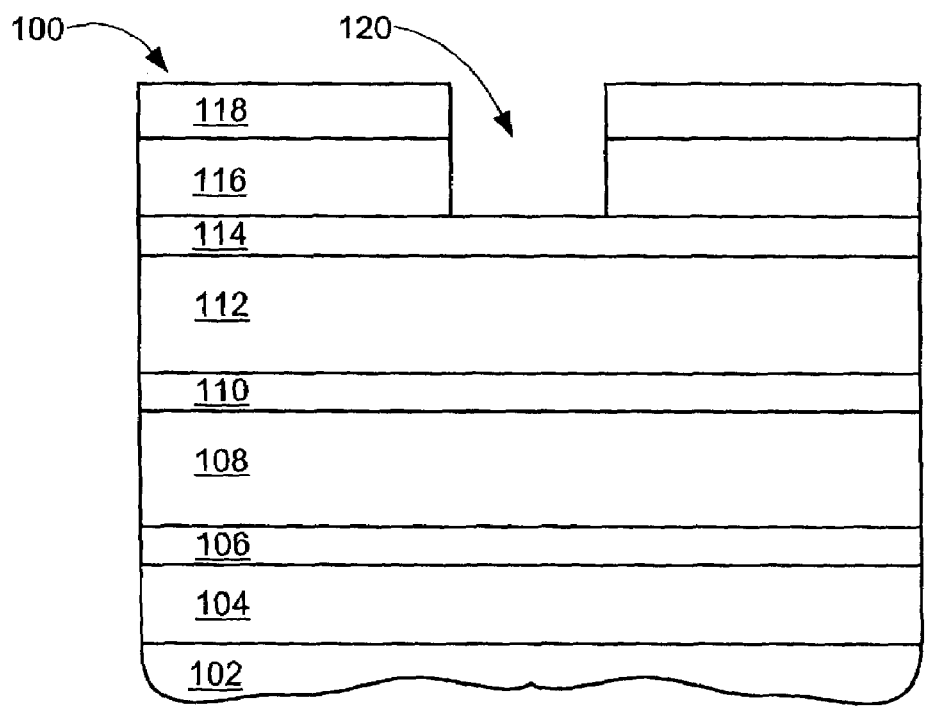
FIG. 2 is the structure of FIG. 1 after processing of a via photoresist to form a via opening therein.

Referring now to FIG. 2, therein is shown the structure of FIG. 1 after processing of the via photoresist 118 to form a via opening therein. The via photoresist 118 is then used to form a first via opening 120 in the masking layer 116 which exposes the third barrier layer 114. This forming process, as most of the opening forming processes herein, can be performed by a number of different processes, such as an anisotropic wet or dry etch.

Figure 3:
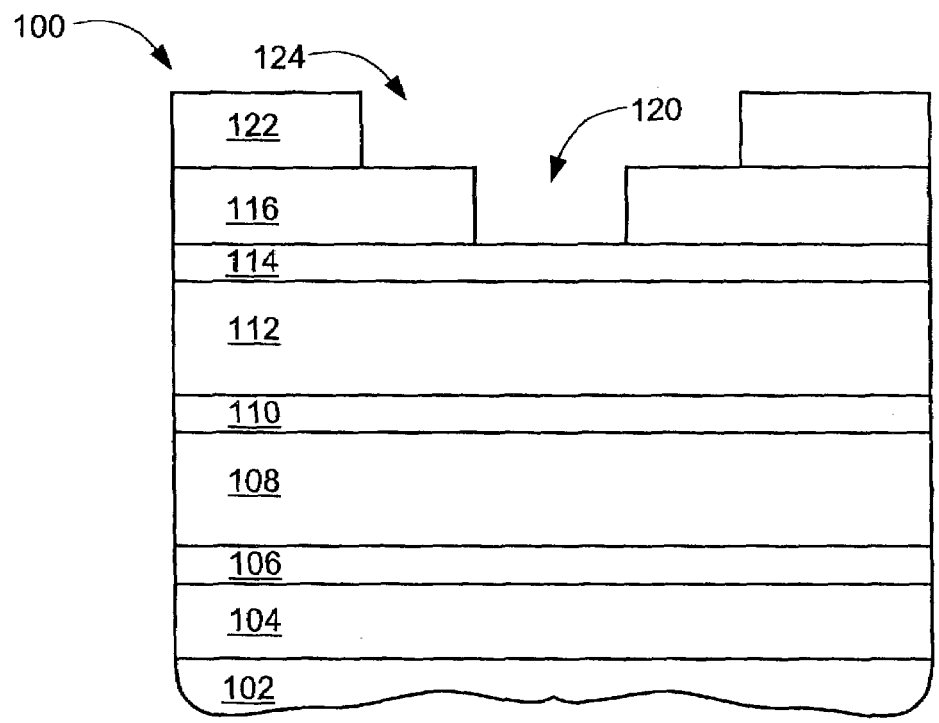
FIG. 3 is the structure of FIG. 2 after processing with the via photoresist removed and a trench photoresist deposited.

Referring now to FIG. 3, therein is shown the structure of FIG. 2 after processing with the via photoresist 118 of FIG. 2 is removed and a trench mask or trench photoresist 122 is deposited. The trench photoresist 122 is processed to form a first trench opening 124 over the first via opening 120. At this step, only the trench photoresist 122 is affected by the processing; i.e., the first via opening 120 is unchanged.

Figure 4:
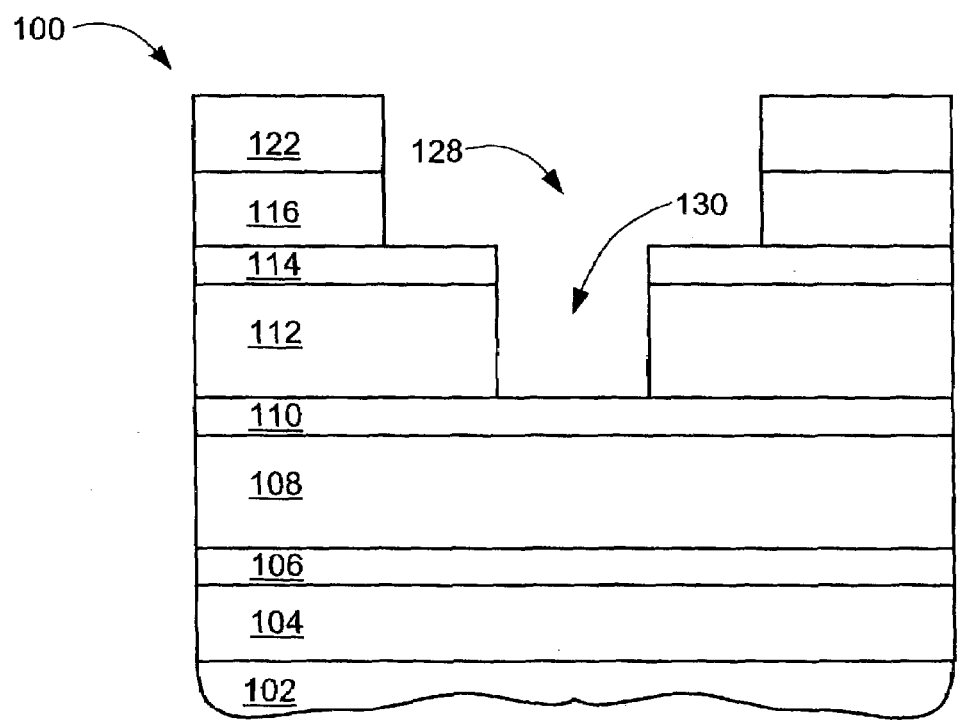
FIG. 4 is the structure of FIG. 3 after transference the first trench opening and the first via opening.

Referring now to FIG. 4, therein is shown the structure of FIG. 3 after transference of the first trench opening 124 and the first via opening 120 of FIG. 3. An etching process forms a second trench opening 128 in the masking layer 116 and a second via opening 130 simultaneously in the third barrier layer 114 and the second dielectric layer 112.

At this step, the second barrier layer 110 and the third barrier layer 114 act as etch stop layers. Thus, the second barrier layer 110 and the area of the third barrier layer under the second trench opening 128 around the second via opening 130 are exposed.

Figure 5:
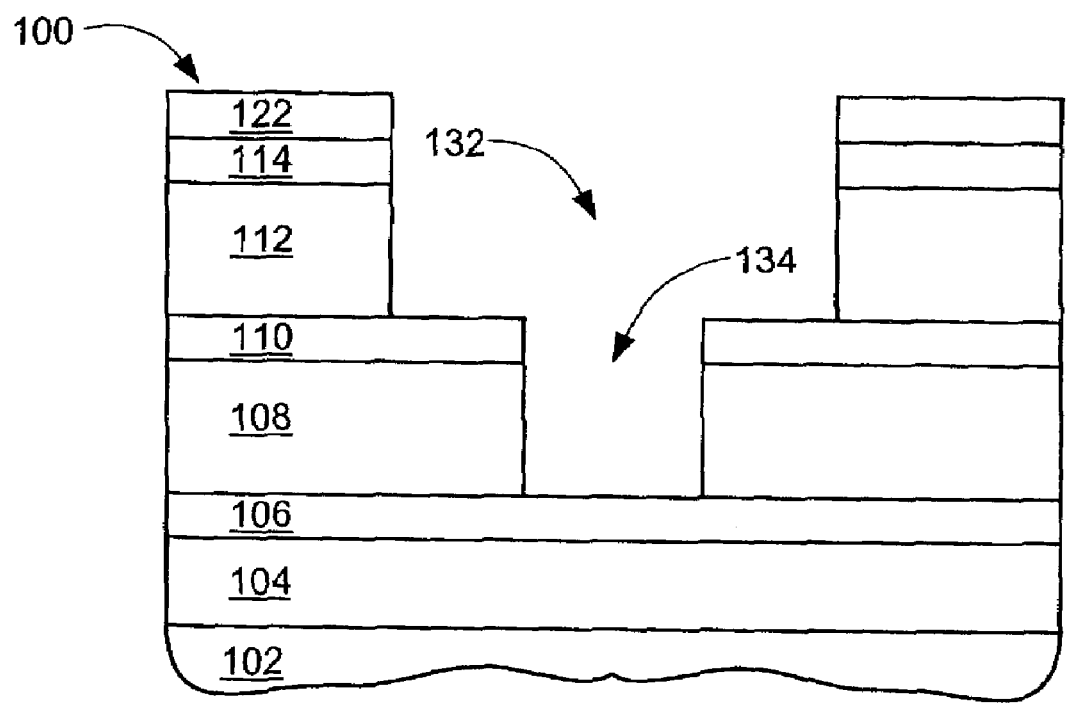
FIG. 5 is the structure of FIG. 4 after further etching simultaneously forms a trench and via.

Referring now to FIG. 5, therein is shown the structure of FIG. 4 after further etching forms a trench 132 in the second dielectric layer 112 and in the third barrier layer 114. Simultaneously, a via 134 is formed in the first dielectric layer 108 and the second barrier layer 110.

The trench 132 is patterned by the second trench opening 128 of FIG. 4 and the via 134 is patterned by the second via opening 130 of FIG. 4. It will be noted at this point that the trench photoresist 122 will also be reduced in thickness by the etching process.

Figure 6:
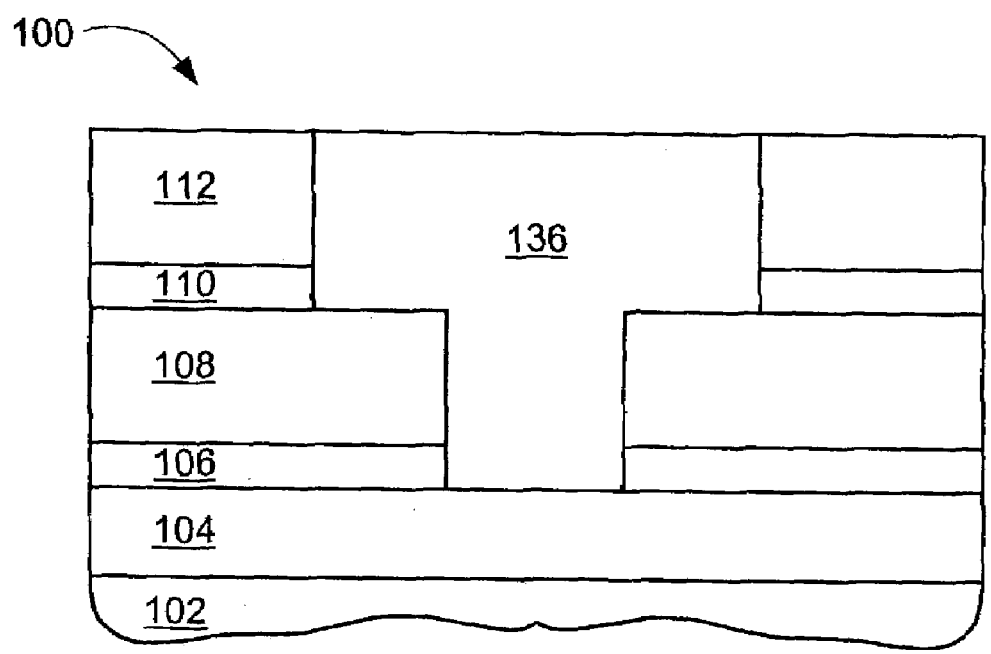
FIG. 6 is a completed interconnect region of the integrated circuit in accordance with the present invention.

Referring now to FIG. 6, therein is shown a completed interconnect region of the integrated circuit 100 in accordance with the present invention. A further etch process has been implemented to remove the remaining trench photoresist 122 of FIG. 5, the masking layer 116, the exposed portion of the second barrier layer 110, and the exposed portion of the first barrier layer 106.

The trench 132 and the via 134 of FIG. 5 have been filled in with a via and trench conductor 136 which is in conductive contact with the first conductor 104.

The top surface of the via and trench conductor 136, as well as the top surface of the second dielectric layer 112, have been planarized for further processing. A cap layer could be deposited on the top surface, or another layer or layers of interconnects could be placed over the top surface.

Figure 7:
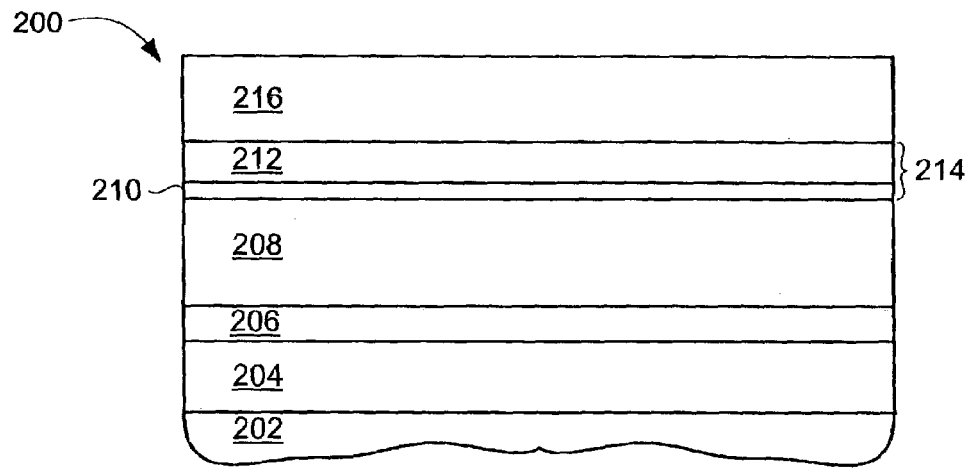
FIG. 7 is a close-up of an alternate interconnect for an integrated circuit in accordance with the present invention.

Referring now to FIG. 7, therein is shown a close up of an alternate interconnect for an integrated circuit 200 in accordance with the present invention. The integrated circuit 200 has a base 202 which may consist of a substrate containing transistors and various dielectric layers (not shown).

Above the base 202 in a trench in a further dielectric layer (not shown) is a first conductor 204. The first conductor 204 is covered by a further dielectric layer, which can be an etch stop layer, designated as a first barrier layer 206.

Above the first barrier layer 206 is a first dielectric layer 208. The first dielectric layer 208 may be a low dielectric constant material having a dielectric constant under 3.9. It could also be an ultra-low dielectric constant material having a dielectric constant under 2.5 and can also be porous.

A dielectric bottom hardmask layer, designated as a first hardmask 210, is deposited on the first dielectric layer 208 and a dielectric top hardmask layer, designated as a second hardmask 212, is deposited on the first hardmask 210 to form a bi-level hardmask layer, designated as a masking layer or a bi-level hardmask 214.

Deposited on the bi-level hardmask 214 is a via photoresist 216.

Figure 8:
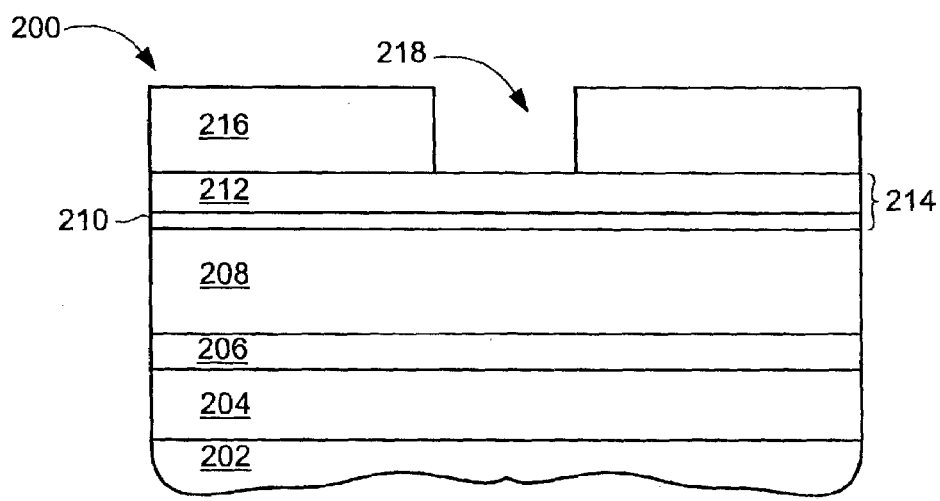
FIG. 8 is a view of a via photoresist after processing to form a first via opening.

Referring now to FIG. 8, therein is shown the via photoresist 216 after processing to form a first via opening 218 therein. Forming the first via opening 218 exposes the second hardmask 212.

Figure 9:
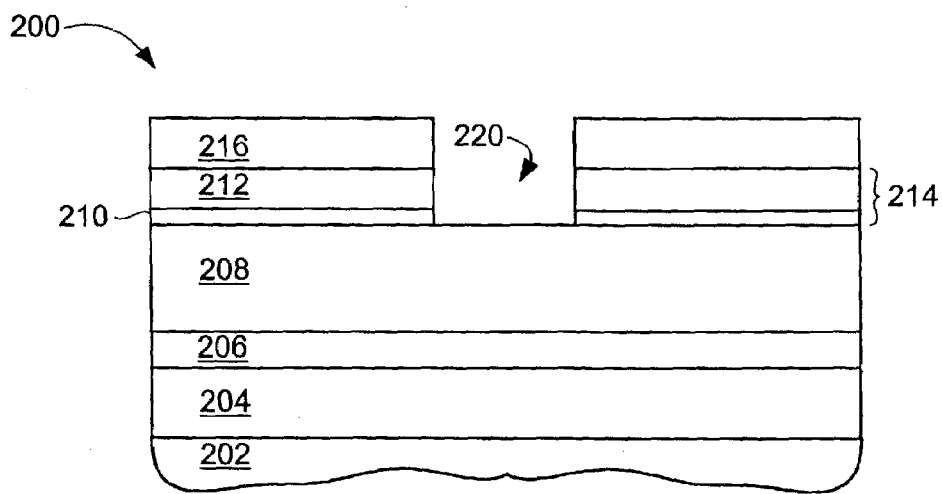
FIG. 9 is the structure of FIG. 8 after transference of the first via opening to a bi-level hardmask layer.

Referring now to FIG. 9, therein is shown the structure of FIG. 8 after transference of the first via opening 218 of FIG. 8 to the bi-level hardmask 214 to form a second via opening 220 in both the second hardmask 212 and the first hardmask 210, which act as a via mask. The second via opening 220 exposes the first dielectric layer 208.

Figure 10:
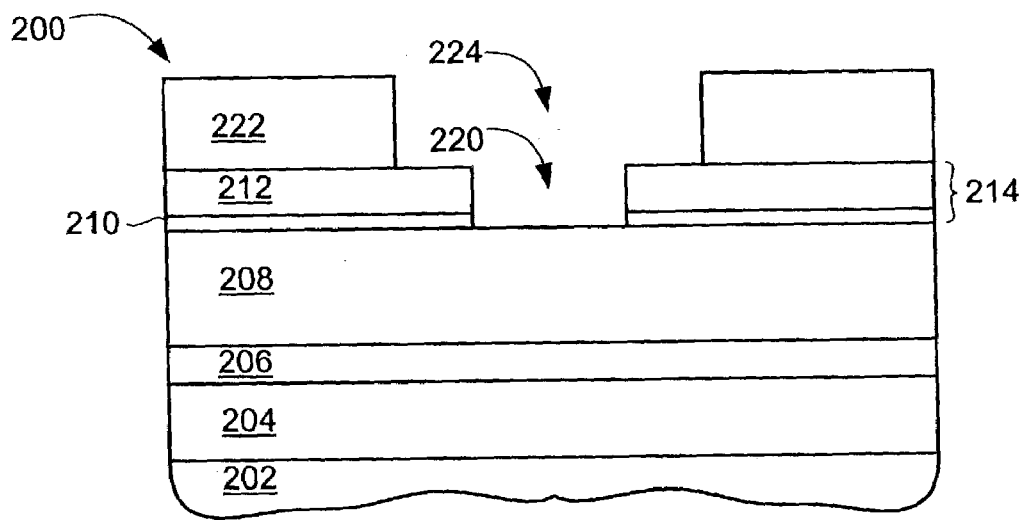
FIG. 10 is the structure of FIG. 8 after removal of the via photoresist.

Referring now to FIG. 10, therein is shown the structure of FIG. 8 after removal of the via photoresist 216 of FIG. 9. A trench mask or trench photoresist 222 has been deposited on the second hardmask 212 and processed to form a first trench opening 224. The second via opening 220 remains the same.

The subsequent steps shown in FIGS. 11 through 14 occur in a continuous sequence which simultaneously forms a trench and a via.

Figure 11:
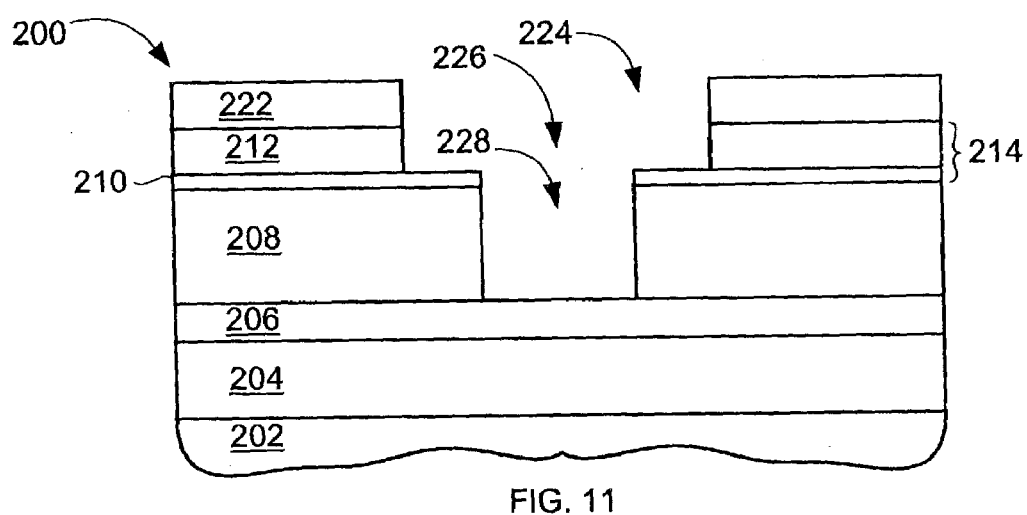
FIG. 11 is the structure of FIG. 10 with the first trench opening used to form a second trench opening in the second hardmask.

Referring now to FIG. 11, therein is shown the structure of FIG. 10 with the first trench opening 224 in the trench photoresist 222 used to form a second trench opening 226 in the second hardmask 212. Simultaneously, the second via opening 220 is used to form a third via opening 228 in the first dielectric layer 208.

The second trench opening 226 exposes a portion of the first hardmask 210 around the third via opening 228 and the third via opening 228 exposes a portion of the first barrier layer 206. The first barrier layer 206 and the first hardmask 210 act as etch stop layers.

Figure 12:
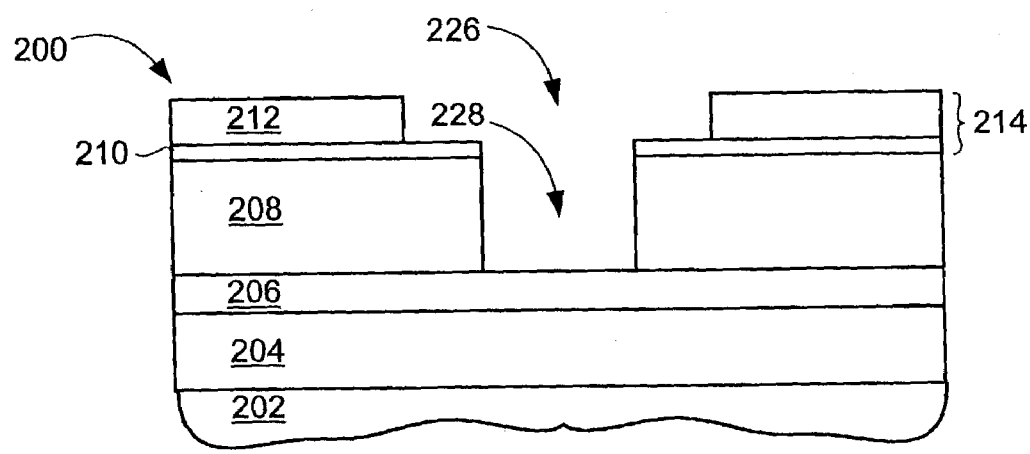
FIG. 12 is the structure of FIG. 11 after the removal of the trench photoresist.

Referring now to FIG. 12, therein is shown the structure of FIG. 11 after the removal of the trench photoresist 222. The second trench opening 226 and the third via opening 228 are unchanged from FIG. 11.

Figure 13:
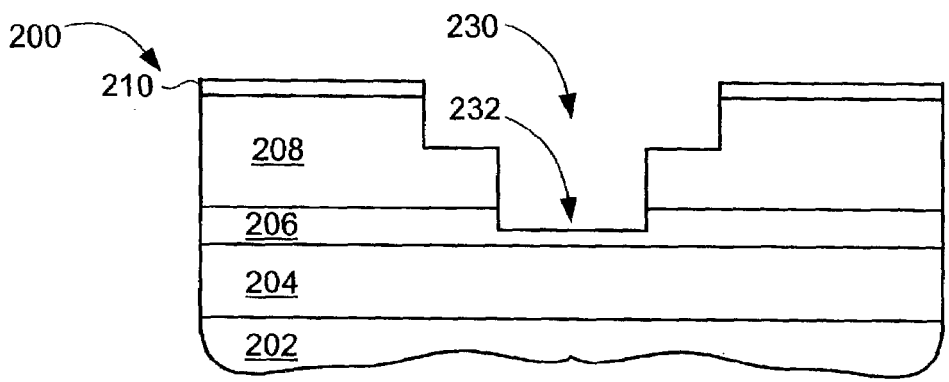
FIG. 13 is the structure of FIG. 12 after removal of the second hardmask.

Referring now to FIG. 13, therein is shown the structure of FIG. 12 after the removal of the second hardmask 212 of FIG. 12. The removal of the second hardmask 212 uses the second trench opening to form a trench 230 through the first hardmask 210 and into the first dielectric layer 208. Simultaneously, the third via opening 228 is extended through the first barrier layer 206 to form, in cooperation with the third via opening 228, a forth via opening 232.

In FIG. 13, the trench 230 and a via opening 232 are shown partially formed to show the simultaneous and continuing formation process. The selectivity between the first barrier layer 206 and the first dielectric layer 208 are high so that the trench 230 can be formed to a controlled depth without etching through the first barrier layer 206.

Figure 14:
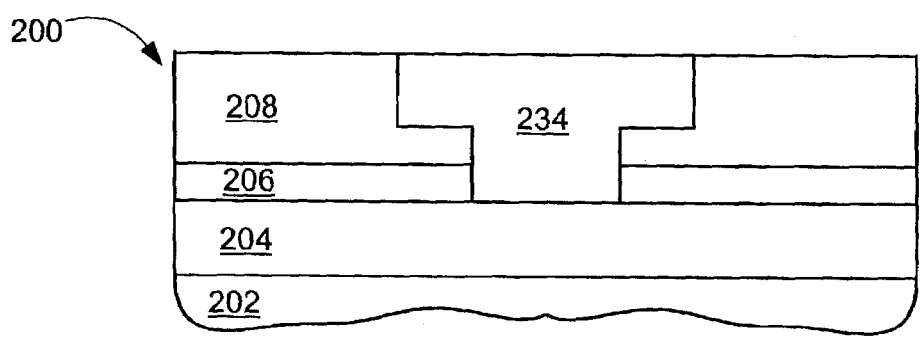
FIG. 14 is a view of the completed interconnect for an integrated circuit in accordance with the present invention.

Referring now to FIG. 14, therein is shown the completed interconnect for the integrated circuit 200 in accordance with the present invention. A blanket etch has been performed to remove the first hardmask 210 and etch through the first barrier layer 206 to complete the via opening 232.

The trench 230 and the via opening 232 of FIG. 14 have been filled in with a via and trench conductor 234 which is in conductive contact with the first conductor 204.

The top surface of the via and trench conductor 234, as well as the top surface of the first dielectric layer 208, have been planarized for further processing. A cap layer could be deposited on the top surface, or another layer or layers of interconnects could be placed over the top surface.

The conductors are a metal such as copper. The dielectric barrier layers and masking layers herein can be such materials as silicon nitride, silicon oxide, silicon oxynitride, etc. The dielectric layers herein can be such materials as fluorine doped silicon oxide, carbon doped silicon oxide, spin-on coated low dielectric constant material, spin-on coated porous low dielectric constant material, etc.

Figure 15A:
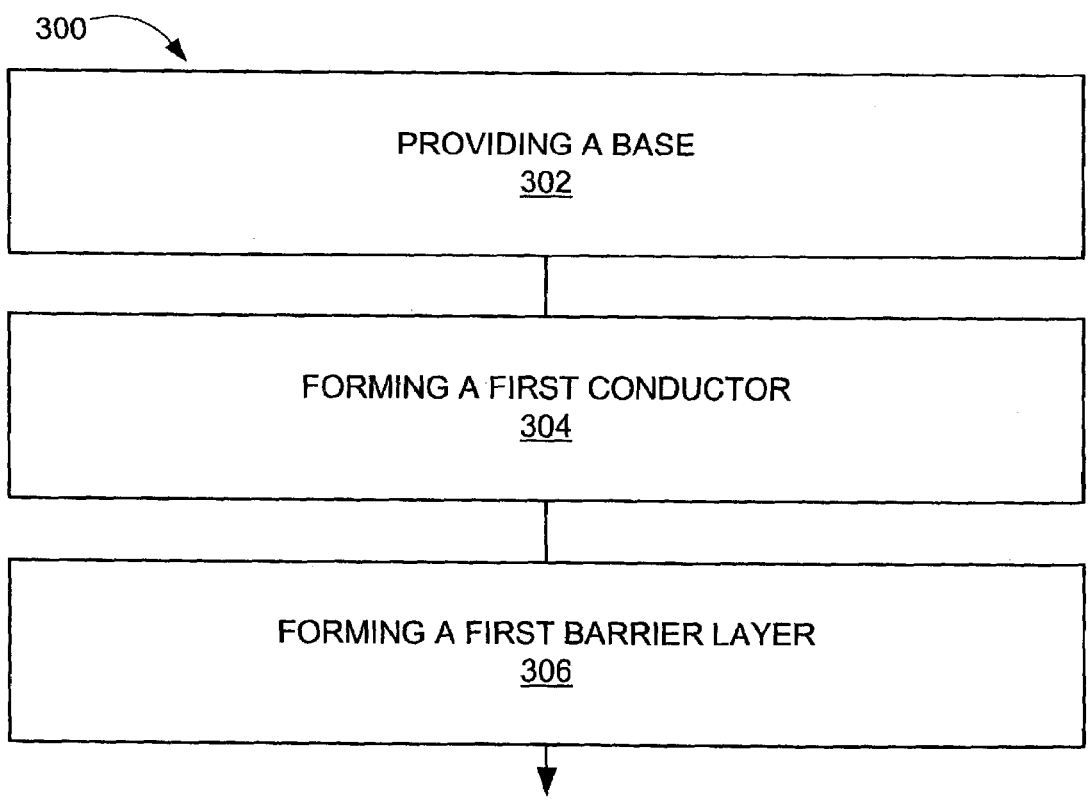
FIGS. 15A and 15B is a simplified flow chart of the method of the present invention.
Figure 15B:
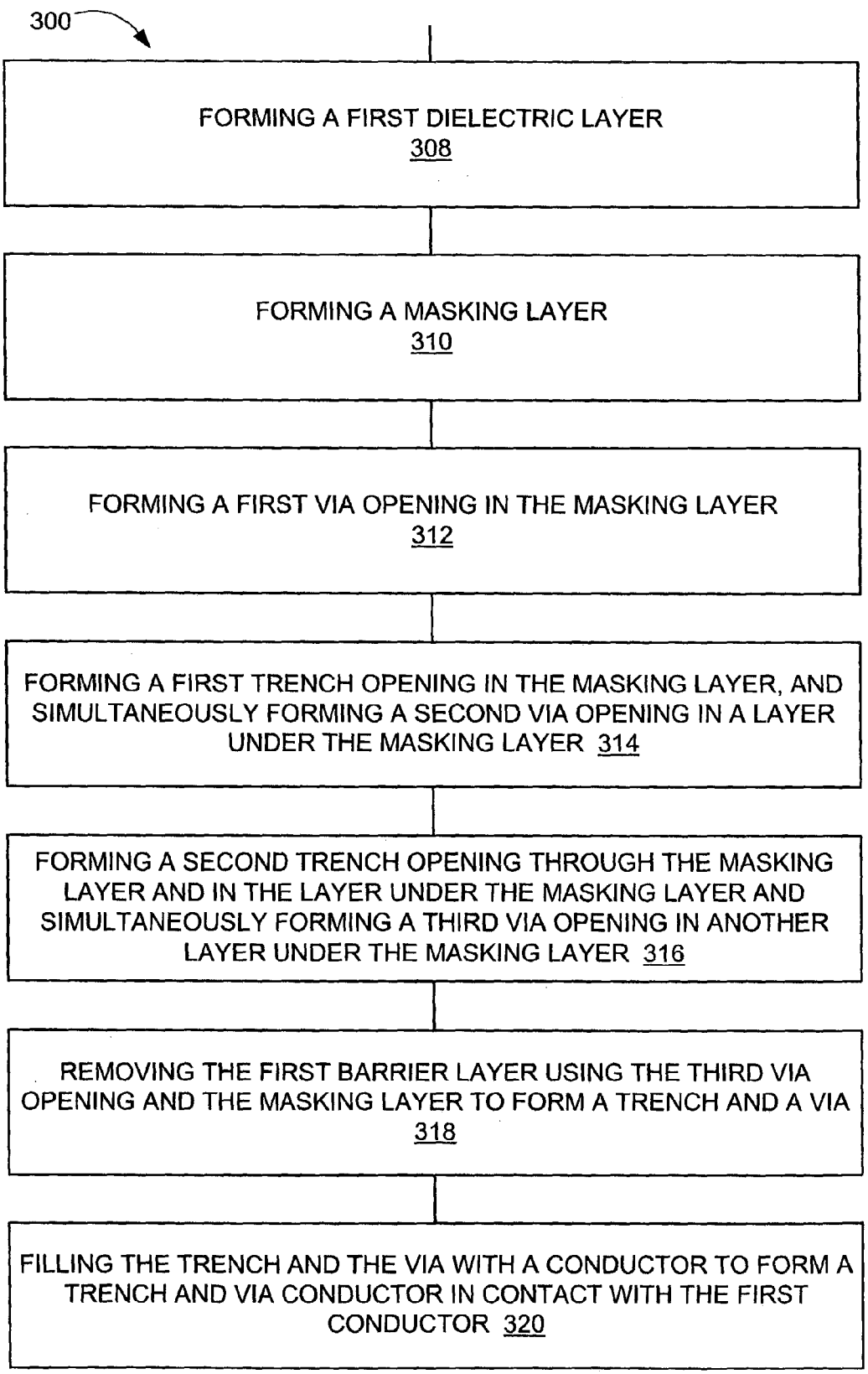

Referring now to FIGS. 15A and 15B, therein is shown a simplified flow chart of a method 300 of the present invention. The method 300 includes: (in FIG. 15A) a step 302 of providing a base: a step 304 of forming a first conductor; a step 306 forming a first barrier layer; (continued in FIG. 15B) a step 308 forming a first dielectric layer; a step 310 of forming a masking layer; a step 312 of forming a first via opening in the masking layer; a step 314 of forming a first trench opening in the masking layer, and simultaneously forming a second via opening in a layer under the masking layer; a step 316 of forming a second trench opening through the masking layer and in the layer under the masking layer and simultaneously forming a third via opening in another layer under the masking layer; a step 318 of removing the first barrier layer using the third via opening and the masking layer to form a trench and a via; and a step 320 of filling the trench and the via with a conductor to form a trench and via conductor in contact with the first conductor.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope and equivalents of the included claims. All matters hithertofore set forth or shown in the accompanying drawings are to be interpreted in an illustrative and non-limiting sense.

The invention claimed is:

1. A method of manufacturing an integrated circuit comprising:
    providing a base;
    forming a first conductor on the base;
    forming a first barrier layer over the first conductor;
    forming a first dielectric layer over the first barrier layer;
    forming a second barrier layer over the first dielectric layer;
    forming a masking layer over the first dielectric layer;
    forming a first via opening in the masking layer;
    forming a first trench opening in the masking layer and simultaneously forming a second via opening in the second barrier layer and a layer under the masking layer;
    forming a second trench opening through the masking layer and in the layer under the masking layer using the first trench opening and simultaneously forming a third via opening in another layer under the masking layer using the second via opening;
    removing the first barrier layer using the third via opening and the masking layer to form a trench and a via; and
    filling the trench and the via with a conductor to form a trench and via conductor in contact with the first conductor.

2. The method as claimed in claim 1 wherein:
    forming the masking layer includes depositing first and second hardmasks with the second hardmask over the first hardmask; and
    forming the first via opening includes forming the first via opening in the first and second hardmasks.

3. The method as claimed in claim 1 wherein:

forming the masking layer includes depositing first and second hardinasks with the second hardmask over the first hardmask; and
forming the first trench opening includes forming the first trench opening in the second hardmask.

4. The method as claimed in claim 1 wherein:
forming the masking layer includes depositing first and second hardmasks with the second hardmask over the first hardmask;
forming the first trench opening includes forming the first trench opening in the second hardmask; and
forming the second via opening includes forming the first via opening in the first hardmask and using the first via opening to form the second via opening in the first dielectric layer.

5. The method as claimed in claim 1 wherein:
forming the masking layer includes depositing first and second hardmasks with the second hardmask over the first hardmask;
forming the second trench opening includes forming the second trench opening through the first hardmask and in the first dielectric layer; and
forming the third via opening includes forming the third via opening in the first barrier layer using the second via opening in the dielectric layer.

6. The method as claimed in claim 1 additionally comprising:
forming a second dielectric layer over the second barrier layer;
forming a third barrier layer over the second dielectric layer; and
wherein:
forming the masking layer forms the masking layer over the third barrier layer;
forming the second via opening forms the second via opening in the third barrier layer and the second dielectric layer; and
forming the second trench opening forms the second trench opening in the third barrier layer and the second dielectric layer and the simultaneously forming the third via opening forms the third via opening in the second barrier layer and first dielectric layer.

7. The method as claimed in claim 1 wherein forming the masking layer includes:
depositing a sacrificial bottom or dielectric anti-reflective coating.

8. The method as claimed in claim 1 including:
forming a via mask that includes depositing a photoresist and processing the phocoresist to form a pattern for the first via opening.

9. The method as claimed in claim 1 including:
forming a trench mask that includes depositing a photoresist and processing the photoresist to form a pattern for the first trench opening.

10. A method of manufacturing an integrated circuit comprising:
providing a base;
forming a first conductor on the base;
forming a first barrier layer over the first conductor;
forming a first dielectric layer over the first barrier layer;
forming a second barrier layer over the first dielectric layer;
forming a masking layer over the first dielectric layer;
forming a via mask over the masking layer;
forming a first via opening in the masking layer using the via mask;
removing the via mask;
forming a trench mask over the masking layer;
forming a first trench opening in the masking layer using the trench mask and simultaneously forming a second via opening in the second barrier layer and a layer under the masking layer using the first via opening;
removing the trench mask;
forming a second trench opening through the masking layer and in the layer under the masking layer using the first trench opening and simultaneously forming a third via opening in another layer under the masking layer using the second via opening;
removing the first barrier layer using the third via opening and the masking layer to form a trench and a via; and
filling the trench and the via with a conductor to form a trench and via conductor in contact wit the first conductor.

11. The method as claimed in claim 10 wherein:
forming the masking layer includes depositing first and second hardmnsks with the second hardmask over the first hardmask of different materials; and
forming the first via opening includes forming the first via opening in the first and second hardmasks.

12. The method as claimed in claim 10 wherein:
forming the masking layer includes depositing first and second hardmasks with the second hardmask over the first hardmask; and
forming the first trench opening includes forming the first trench opening in the second hardmask.

13. The method as claimed in claim 10 wherein:
forming the masking layer includes depositing first and second hardmasks with the second hardmask over the first hardmask of different materials;
forming the first trench opening includes forming the first trench opening in the second hardmask; and
forming the second via opening includes forming the first via opening in the first hardmask and using the first via opening to form the second via opening in the first dielectric layer.

14. The method as claimed in claim 10 wherein:
forming the masking layer includes depositing first and second hardmasks with the second hardmask over the first hardmask of different materials;
forming the second trench opening includes forming the second trench opening through the first hardmask and in the first dielectric layer; and
forming the third via opening includes forming the third via opening in the first barrier layer using the second via opening in the dielectric layer.

15. The method as claimed in claim 10 additionally comprising:
forming a second dielectric layer over the second barrier layer;
forming a third barrier layer over the second dielectric layer; and
wherein:
forming the masking layer forms the masking layer over the third barrier layer;
forming the second via opening forms the second via opening in the third barrier layer and the second dielectric layer; and
forming the second trench opening forms the second trench opening in the third barrier layer and the second dielectric layer and the simultaneously forming the third via opening forms the third via opening in the second barrier layer and first dielectric layer.

16. The method as claimed in claim 10 wherein forming the masking layer includes depositing a sacrificial bottom or dielectric anti-reflective coating.

17. The method as claimed in claim 10 wherein:
forming the via mask includes depositing a photoresist and processing the photoresist to form a pattern for the first via opening.

18. The method as claimed in claim 10 wherein:
forming the trench mask includes depositing a photoresist and processing the photoresist to form a pattern for the first trench opening.

19. A method of manufacturing an integrated circuit comprising:
providing a base;
forming a first conductor on the base;
forming a first barrier layer over the first conductor;
forming a first dual damascene dielectric layer over the first barrier layer;
forming a second barrier layer over the first dual damascene dielectric layer;
forming a masking layer over the first dual damascene dielectric layer;
forming a via mask over the masking layer;
forming a first via opening in the masking layer using the via mask;
removing the via mask;
forming a trench mask over the masking layer;
forming a first trench opening in the masking layer using the trench mask and simultaneously forming a second via opening in the second barrier layer and the first dual damascene dielectric layer using the first via opening;
removing the trench mask;
forming a second trench opening in the masking layer and in the first dual damascene dielectric layer using the first trench opening and simultaneously forming a third via opening in the first barrier layer using the second via opening;
removing the masking layer and removing the first barrier layer using the third via opening to form a trench and a via; and
filling the trench and the via with a conductor to form a trench and via conductor in contact with the first conductor.

20. A method of manufacturing an integrated circuit comprising:
providing a base;
forming a first conductor on the base;
forming a first barrier layer over the first conductor;
forming a first dual damascene dielectric layer over the first barrier layer;
forming a second barrier layer over the first dual damascene dielectric layer;
forming a second dual damascene dielectric layer over the second barrier layer
forming a third barrier layer over the second dual damascene dielectric layer;
forming a masking layer over the first dual damascene dielectric layer;
forming a via mask over the masking layer;
forming a first via opening in the masking layer using the via mask;
removing the via mask;
forming a trench mask over the masking layer;
forming a first trench opening in the masking layer using the trench mask and simultaneously forming a second via opening in the third barrier layer and second dual damascene dielectric layer using the first via opening;
removing the trench mask;
forming a second trench opening in the masking layer and in the third barrier layer and second dual damascene dielectric layer using the first trench opening and simultaneously forming a third via opening in the second barrier layer and first dual damascene dielectric layer using the second via opening;
removing the masking layer and removing the first barrier layer using the third via opening to form a trench and a via; and
filling the trench and the via with a conductor to form a trench and via conductor in contact with the first conductor.

* * * * *